United States Patent [19]

Matsuyama et al.

[11] 4,380,021
[45] Apr. 12, 1983

[54] SEMICONDUCTOR INTEGRATED CIRCUIT

[75] Inventors: Mitsuo Matsuyama; Ichiro Ohhinata; Junjiro Kitano, all of Yokohama, Japan

[73] Assignee: Hitachi, Ltd., Tokyo, Japan

[21] Appl. No.: 131,931

[22] Filed: Mar. 21, 1980

[30] Foreign Application Priority Data

Mar. 22, 1979 [JP] Japan .................. 54-32285

[51] Int. Cl.$^3$ ............................. H01L 29/48
[52] U.S. Cl. ............................. 357/15; 357/35; 357/38; 357/52
[58] Field of Search ............. 357/15, 52, 53, 41, 357/35, 38

[56] References Cited

U.S. PATENT DOCUMENTS

| | | | |
|---|---|---|---|
| 3,571,674 | 3/1971 | Yu et al. | 357/15 |
| 3,623,029 | 11/1971 | Davidson | 357/15 |
| 3,737,742 | 6/1973 | Brever et al. | 357/51 |
| 3,909,837 | 9/1975 | Kronlage | 357/15 |
| 3,943,554 | 3/1976 | Russell et al. | 357/15 |
| 4,119,446 | 10/1978 | Mastroianni | 357/15 |
| 4,199,860 | 4/1980 | Beelitz et al. | 357/15 |

FOREIGN PATENT DOCUMENTS

| | | | |
|---|---|---|---|
| 2423114 | 11/1974 | Fed. Rep. of Germany | 357/15 |
| 2617855 | 11/1976 | Fed. Rep. of Germany | 357/15 |

OTHER PUBLICATIONS

R. Noyce et al., "Schottky Diodes Make IC Sense," Electronics, Jul. 21, 1969, pp. 74–80.

*Primary Examiner*—Joseph E. Clawson, Jr.
*Attorney, Agent, or Firm*—Antonelli, Terry and Wands

[57] ABSTRACT

A semiconductor integrated circuit with a short turn-off time in which a high breakdown voltage semiconductor element and a Schottky barrier diode are fabricated into a semiconductor substrate, is disclosed. In the integrated circuit, within a semiconductor substrate of a first conductivity type, a diffusion layer with a low impurity concentration disposed deeply which is used as one layer of a high breakdown voltage semiconductor element formed by a high breakdown voltage process and a diffusion layer with a high impurity concentration disposed more shallowly than the diffusion layer with a low impurity concentration, are formed so as to partially couple with each other. The diffusion layer with the high impurity concentration is used for both the ohmic contact for the electrode of the diffusion layer with the low impurity concentration and for a guard ring for a Schottky barrier diode. With such a construction, a Schottky barrier diode may be assembled into a high breakdown voltage semiconductor element with a minimum increase of area. Accordingly, the semiconductor integrated circuit obtained has a high degree of integration and a short turn-off time.

3 Claims, 11 Drawing Figures

SEMICONDUCTOR INTEGRATED CIRCUIT

The present invention relates to a semiconductor integrated circuit in which a Schottky barrier diode is fabricated into a high breakdown voltage semiconductor element thereby to reduce a turn-off time thereof.

A semiconductor element such as a transistor and a PNPN switch, which has widely been used as a switching element, has a disadvantage of a long turn-off time due to the storage of minority carriers in the base region when it is operated in a saturation region and a cut-off region. In a transistor, for example, minority are injected from the collector region to the base region in the saturation region of the transistor, so that the minority carriers are stored in the base region. For this reason, when a forward voltage is reduced to zero, the minority carriers move from the base region to the collector region. Accordingly, the transistor is not turned off until the minority carriers are recombined progressively to reduce to a given value. In the PNPN switch, the minority carriers are likewise stored in the anode gate region and the cathode gate region, causing the same problem. When the semiconductor element is applied to a circuit operating at a high frequency, it should have a short turn-off time.

To this end, the conventional process has proposed diffusion of heavy metal such as gold in the semiconductor substrate to reduce the storage of the minority carriers and to shorten the turn-off time. This approach indeed may shorten the turn-off time but suffers from a degradation of the current amplification factor $h_{FE}$.

Meanwhile, it is known that, when metal is used in contact with a semiconductor substrate of P- or N-type by sputtering or evaporation, a barrier is produced therebetween due to a difference of the work functions between them, so that the junction has a rectifying characteristic. The semiconductor element with such a rectifying function is known as a Schottky diode or a Schottky barrier diode. If the metal used is properly selected and the junction area is properly formed, the resulting Schottky diode will have a much better rectifying characteristic than that of the PN junction diode of the P- and N-type silicon semiconductors. In the Schottky barrier diode the forward voltage drop under a forwardly biased condition is approximately 0.2 to 0.5 V, depending on the metal used. When aluminum is used the forward voltage drop will be about 0.3 V, while in the PN junction diode the forward voltage drop is about 0.7 V. Additionally, in the Schottky barrier diode, only majority carriers contribute to the operation, so that it is almost free from the storage of the minority carriers. Thus, the Schottky barrier diode has a shorter turn-off time, compared to the usual PN junction diode. Accordingly, use of the Schottky barrier diode enables a circuit to have a good frequency characteristic and a quick response.

The invention will be further described with reference to accompanying drawings, in which.

Figure 1:
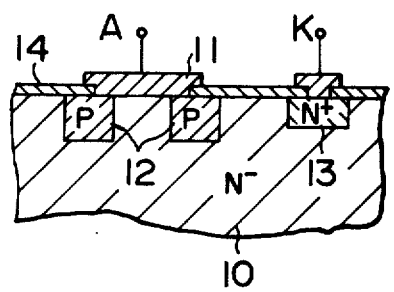
FIG. 1 is a cross sectional view of a Schottky barrier diode.

FIG. 1 is a cross sectional view of the Schottky barrier diode as mentioned above. An N-type silicon substrate 10 has an aluminum electrode 11 deposited by evaporation thereon. Reference numeral 14 designates a silicon oxide layer. A Schottky barrier is formed at the junction surface between the N-type silicon substrate 10 and the aluminum electrode 11. A P-type diffusion layer 12 is formed by selectively diffusing a P-conductivity type impurity such as boron in a frame or ring shape to surround or encircle the Schottky barrier portion. With respect to the wording "frame or ring shape", in an actual integrated circuit, the diffusion layer may be shaped like a frame and not a ring, but it is generally called a ring in this field. Accordingly, such a shape will be called a ring like shape, including a frame like shape in this specification. Further, the above-mentioned P-type diffusion layer is called a guard ring, generally. The guard ring is used to prevent the deterioration of the breakdown voltage around the Schottky barrier caused by concentration of an electric field therearound, or the edge effect, for the purpose of stabilization. Reference numeral 13 designates an N-type diffusion layer with a high impurity concentration for obtaining the ohmic contact to the cathode of the diode.

Figure 2:
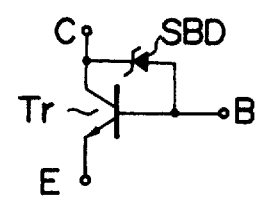
FIG. 2 is a circuit diagram of an NPN transistor designed to operate at a high speed.

FIG. 2 is a circuit diagram which is a combination of a transistor and a Schottky barrier diode. The circuit is an example of the known saturation control methods of a transistor as mentioned above.

As shown, a Schottky barrier diode SBD is connected between the collector C and the base B of an NPN transistor TR, thereby to clamp the collector and base junction (PN junction) to a low voltage. The circuit arrangement eliminates the storage of the minority carriers at the collector and base junction. The current in the Schottky barrier diode SBD, if it flows, is caused by the movement of majority carriers, with little storage of minority carriers. Therefore, the circuit construction shown in FIG. 2 provides a transistor with a short turn-off time or a high switching speed.

Figure 3:
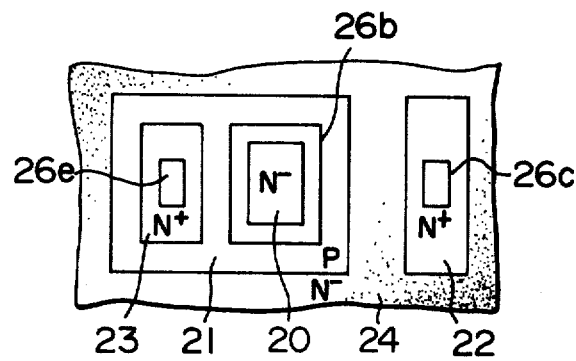
FIGS. 3 and 4 are a plan view and a cross sectional view of a semiconductor integrated circuit of the circuit shown in FIG. 2.
Figure 4:
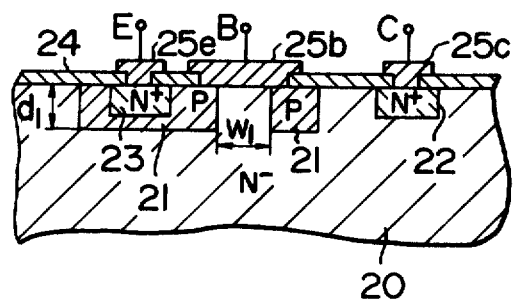

FIGS. 3 and 4 are a plan view and a cross sectional view in the case where the circuit in FIG. 2 is formed in the semiconductor substrate by using a low breakdown voltage process. In FIG. 3, electrodes (metal wiring layer) in FIG. 4 are omitted for ease of illustration. This is correspondingly applied to the remaining embodiments to be described later.

In FIGS. 3 and 4, reference numeral 20 designates an N-type silicon substrate; 21 a P-type diffusion layer; 22 and 23 N-type diffusion layers with a high impurity concentration; 24 a silicon oxide film; 25b, 25c and 25e aluminum wiring layers; 26b, 26c and 26e peripheries or edges of the portions of the aluminum wiring layers 26b, 26c and 26e where they contact with the semiconductor layers, the peripheries corresponding to windows in the silicon oxide layer 24. For a transistor Tr, a collector C is taken out from the N-type diffusion layer 22 with a high impurity concentration in the N-type silicon substrate 20, a base B is taken out from the P-type diffusion layer 21, and an emitter E is taken out from the N-type diffusion layer 23. The N-type diffusion layer 23, the P-type diffusion layer 21 and the N-type silicon substrate 20 serve as an emitter region, a base region and a collector region, respectively. A Schottky diode is formed with the junction surface between the N-type silicon substrate 20 as the collector region and the aluminum wiring layer 25b. In the diode, the N-type silicon substrate 20 serves as a cathode and the aluminum wiring layer 25b as an anode. The aluminum wiring layer 25b serves as the base electrode for the NPN transistor, too. As shown, the cathode and the anode of the Schottky barrier diode SBD are connected to the collector C and the base B of the NPN transistor, respectively, within the N-type silicon substrate 20. The Schottky barrier portion of the Schottky barrier diode SBD is encircled by the P-type diffusion layer 21 in a ring shape. The ring like portion of the P-type diffusion layer 21 forms the guard ring to stabilize the characteristic or increase the breakdown voltage.

The reason why the aluminum wiring layer 25b forming the Schottky barrier diode SBD is used as the base electrode of the NPN transistor Tr, is to improve the degree of integration of the integrated circuit.

Figure 5:
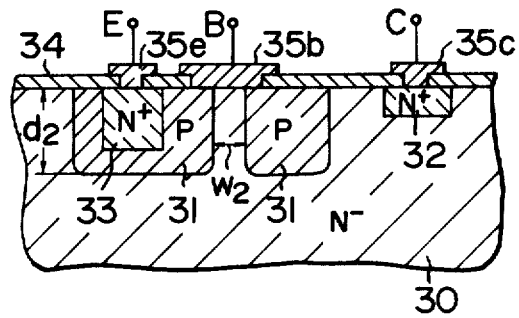
FIG. 5 is a cross sectional view of a semiconductor integrated circuit corresponding to that in FIGS. 3 and 4, in which the dimensions of the P-type diffusion layers are doubled.

For fabricating the circuit as shown in FIG. 2 by using a high breakdown voltage process, it is necessary to decrease the impurity concentration of the N-type silicon substrate and to extend the P-type diffusion layer more deeply within the substrate. This is because to deepen the P-type diffusion layer thereby to increase the radius of curvature of the edge portion of the P-type diffusion layer results in an increase of the breakdown voltage. For example, in the case of a switching element with a breakdown voltage of about 200 V, the depth of the P-type diffusion layer must be 12 to 15 $\mu$m, which depth is about four to five times the depth $d_1$ of the P-type diffusion layer of the usual transistor being about 3 $\mu$m, as shown in FIGS. 3 and 4. Therefore, the semiconductor element requiring a high breakdown voltage is fabricated by the high breakdown voltage process. FIG. 5 is a cross sectional view of a semiconductor integrated circuit of which the P-type diffusion layer is formed to a depth $d_2$ twice that $d_1$ of the P-type diffusion layer of the semiconductor integrated circuit shown in FIGS. 3 and 4. Actually, the depth $d_2$ should be four to five times that $d_1$; however, for ease of understanding, the twice depth $d_2$ is used here. As seen from FIGS. 4 and 5, when the depth of the P-type diffusion layer 31 is doubled as just mentioned, the contact area or the junction area for the Schottky barrier diode is lowered, as illustrated by the widths $w_1$ and $w_2$ in the cross section in FIG. 5. The reason for this is that, in a usual diffusion, a side or lateral diffusion takes place to a degree of 0.7 to 0.8 time the diffusion depth. Thus, the area of the junction surface between the N-type silicon substrate 30 and the aluminum wiring 35b, which forms the Schottky diode becomes small. The junction area is inversely proportional to the forward voltage drop, as described above. Accordingly, for fabricating a high breakdown voltage semiconductor integrated circuit with a short turn-off time as shown in FIG. 2 having a Schottky diode with a small voltage drop, the area of the junction forming the Schottky barrier should be the same as that shown in FIG. 4. Additionally, the width $w_2$ of the guard ring shown in FIG. 5 be equal to that $w_1$ of the guard ring in FIG. 5.

For this reason, conventionally, a semiconductor integrated circuit of the type in which a Schottky barrier diode with a small voltage drop having a guard ring is assembled into a high breakdown voltage semiconductor element needs a large area of the substrate, so that it is difficult to improve a degree of integration of the integrated circuit.

Accordingly, an object of the invention is to provide a semiconductor integrated circuit with a short turn-off time, having a Schottky barrier diode assembled thereinto without requiring a large area and exhibiting a small voltage drop even if it is fabricated by the high breakdown voltage process.

In a semiconductor integrated circuit according to the invention, a diffusion layer with a low impurity concentration and another diffusion layer with a high impurity concentration disposed shallower than the former diffusion layer are formed partially coupled with each other within a semiconductor substrate. The diffusion layer with a low impurity concentration is used as one layer of a high breakdown voltage semiconductor element. The diffusion layer with a high impurity concentration is used for both the ohmic contact for the electrode of the diffusion layer with a low impurity concentration and the guard ring of a Schottky barrier diode. Thus, the semiconductor integrated circuit has a Schottky diode assembled into the high breakdown voltage semiconductor element and a high degree of integration of the circuit.

According to a major aspect of the present invention, there is provided a semiconductor integrated circuit in which a high breakdown voltage semiconductor element and a Schottky barrier diode with a guard ring are assembled into a semiconductor substrate of a first conductivity type, the circuit comprising at least one first diffusion layer with a low impurity concentration of a second conductivity type opposite to the first conductivity type and at least one second diffusion layer with a high impurity concentration of the second conductivity type formed shallower than the first diffusion layer, the first and second diffusion layers being partially coupled with each other within the semiconductor substrate, the first diffusion layer serving as a layer forming the high breakdown voltage element and the second diffusion layer serving as both an ohmic contact for the first diffusion layer and a guard ring of the Schottky barrier diode.

Figure 6:
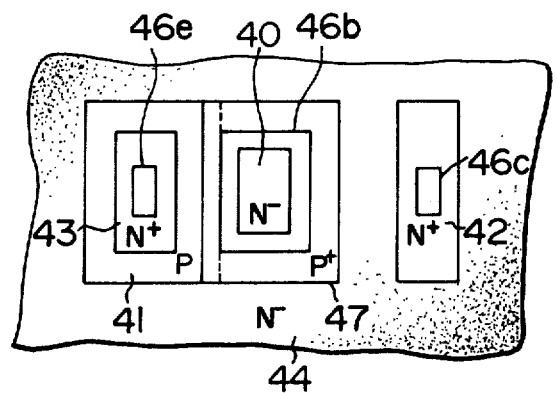
FIGS. 6 and 7 are a plan view and a cross sectional view of an embodiment of a semiconductor integrated circuit according to the invention.
Figure 7:
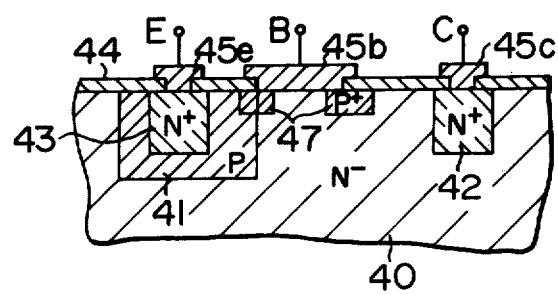

FIGS. 6 and 7 are plan view and a cross sectional view of an embodiment of a semiconductor integrated circuit according to the invention. In FIG. 6, the electrode portions shown in FIG. 7 are omitted for ease of illustration.

In the figure, reference numeral 40 designates an N-type silicon substrate; 41 a P-type diffusion layer with a low impurity concentration; 42 and 43 N-type diffusion layers with high impurity concentration; 44 a silicon oxide layer; 45b, 45c and 45e aluminum wiring layers. Reference numerals 46b to 46e designate peripheries or edges of the portions of the aluminum wiring layers 45b to 45e which portions contact with the semiconductor layers. A P-type diffusion layer 47 with a high impurity concentration is selectively formed in the N-type silicon substrate 40 in a ring shape along the periphery or edge of the junction between the substrate 40 and the aluminum wiring layer 45b. The semiconductor integrated circuit shown in FIGS. 6 and 7 corresponds to the circuit shown in FIG. 2 fabricated in a high breakdown voltage process. In this embodiment, the impurity concentration of the N-type silicon substrate 40 is considerably lower than that of the substrate of an ordinary low breakdown voltage semiconductor. Incidentally, in order to raise the breakdown voltage by one order of magnitude, it is necessary to decrease the impurity concentration by about one order of magnitude.

For an NPN transistor corresponding to the NPN transistor Tr shown in FIG. 2, a collector terminal C is taken out from the N-type diffusion layer 42 with a high impurity concentration formed in the N-type silicon substrate 40; a base terminal B from the P-type diffusion layer 41; an emitter terminal E from the N-type diffusion layer 43. The N-type diffusion layer 43, the P-type diffusion layer 41 and the N-type silicon substrate 40 serve as an emitter region, a base region and a collector region. The P-type diffusion layer 41 is formed to a relatively larger depth for obtaining a high breakdown voltage and therefore the impurity concentration in its surface portion is low. For this reason, the base terminal B is taken out through the P-type diffusion layer 47 with a high impurity concentration and the aluminum wiring layer 45b, ensuring an ohmic contact. The N-type diffusion layers 42 and 43 are simultaneously formed.

For a Schottky barrier diode corresponding to that SBD shown in FIG. 2, it is formed by making a contact of the aluminum wiring layer 45b to the N-type silicon substrate 40, the cathode being the N-type silicon substrate 40 and the anode being the aluminum wiring layer 45b. The Schottky barrier diode has a guard ring formed by the ring like diffusion layer 47 with a high impurity concentration. The P-type diffusion layer 47 of the guard ring formed also serves as the P-type diffusion layer with a high impurity concentration for the base contact of the NPN transistor. Thus, the anode and the cathode of the Schottky barrier diode, being formed of the aluminum wiring layer 45b and the N-type silicon substrate respectively, are connected to the base and the collector of the transistor within the substrate 40.

The semiconductor integrated circuit shown in FIGS. 6 and 7, thus constructed, has exactly the same equivalent circuit as that shown in FIG. 2. In operation, the base-collector junction of the NPN transistor is clamped to a low voltage, as in the circuit of FIG. 2. For this reason, the storage of the minority carriers is eliminated at the base-collector junction, so that the turn-off time is short and a high speed switching operation is possible. When current flows through the Schottky diode itself, the current flow in this base is caused by the movement of the majority carriers alone and not of the minority carriers.

In the above-mentioned semiconductor integrated circuit including the Schottky barrier diode, which is formed by the high breakdown voltage process, the provision of the Schottky barrier diode guard ring formed by the P-type diffusion layer with the high impurity concentration disposed shallower for the base contact of the transistor restricts the diffusion in a lateral direction. Accordingly, a Schottky barrier diode with a desired characteristic is fabricated into the high breakdown voltage semiconductor element, with a minimum increase of area. In other words, the degree of integration of the integrated circuit is improved by straightly using the conventional high breakdown voltage process, which is very useful.

Figure 8:
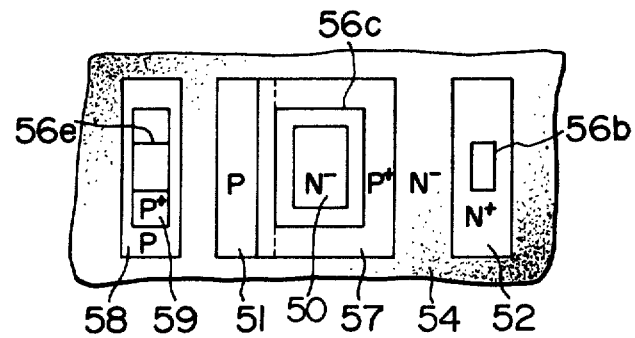
FIGS. 8 and 9 are a plan view and a cross sectional view of another embodiment of the semiconductor integrated circuit according to the invention.
Figure 9:
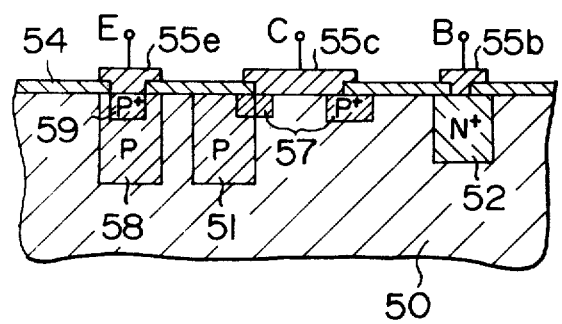

Turning now to FIGS. 8 and 9, there are shown a plan view and a cross sectional view of another embodiment of the semiconductor integrated circuit. In FIG. 8, the electrode portions in FIG. 9 are omitted. In the figure, reference numeral 50 designates an N-type silicon substrate with a low impurity concentration; 51 and 58 P-type diffusion layers with a low impurity concentration; 52 an N-type diffusion layer with a high impurity concentration; 57 and 59 P-type diffusion layers with a high impurity concentration; 54 a silicon oxide layer; 55b, 55c and 55e aluminum wiring layers; 56b, 56c and 56e peripheries or edges of the portions of the aluminum wiring layers 55b to 55e which portions contact with the semiconductor layers. The P-type diffusion layer 57 with a high impurity concentration extends in a ring shape along the periphery or edge of the junction between the substrate 50 and the aluminum wiring layer 55c. This embodiment is a high breakdown voltage semiconductor integrated circuit with a short turn-off time, which is a combination of a lateral PNP transistor and a Schottky barrier diode. A PNP transistor in the integrated circuit has an emitter terminal E and a collector terminal C which are coupled with the P-type diffusion layers 59 and 57 with a high impurity concentration through the aluminum wiring layer 55e and 55c and a base terminal B coupled with the N-type diffusion layer 52 with a high impurity concentration through the aluminum wiring layer 55b. The P-type diffusion layer 58, the N-type silicon substrate 50 and the P-type diffusion layer 51 serve as an emitter region, a base region and a collector region, respectively.

A Schottky barrier diode in the integrated circuit is formed by making contact of the aluminum wiring layer 55c with the N-type silicon substrate 50, having a guard ring formed by the P-type diffusion layer 57 shaped like a ring. The P-type diffusion layer 57 serving as the guard ring is also used as the P-type diffusion layer 57 with a high impurity concentration for the collector contact of the PNP transistor. The aluminum wiring layer 55c forming the anode of the Schottky barrier diode and the N-type silicon substrate 50 forming the cathode are connected to the collector and the base of the PNP transistor, respectively.

The integrated circuit thus constructed also realizes a PNP transistor which is operable at a high speed with a short turn-off time, and has a Schottky barrier diode with a desired characteristic assembled thereinto with the minimum area increased, by using the conventional high breakdown voltage process straightly.

Figure 10:
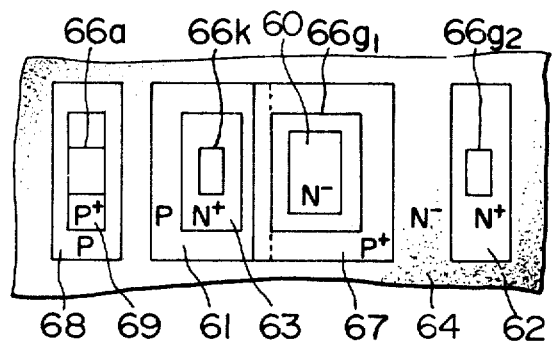
FIGS. 10 and 11 are a plan view of a cross sectional view of a still another embodiment of the semiconductor integrated circuit according to the invention.
Figure 11:
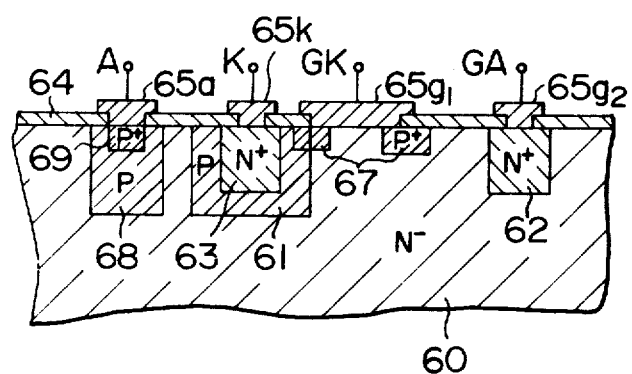

FIGS. 10 and 11 respectively show a plan view and a cross sectional view of another embodiment of the semiconductor integrated circuit. In FIG. 10, the electrodes are omitted as in the previous embodiments. In the figure, reference numeral 60 represents an N-type silicon substrate with a low impurity concentration; 61 and 68 P-type diffusion layers with a low impurity concentration; 62 and 63 N-type diffusion layers with a high impurity concentration; 64 a silicon oxide layer; 65a, 65k, 65$g_1$ and 65$g_2$ aluminum wiring layers; 66a, 66k, 66$g_1$ and 66$g_2$ peripheries or edges of the portions of the aluminum wiring layers 65a, 65k, 65$g_1$ and 65$g_2$ which portions contact the semiconductor layers. Reference numerals 67 and 69 denote P-type diffusion layers with a high impurity concentration. Particularly, the P-type diffusion layer 67 is formed by selective diffusion along the periphery or edge of the junction between the N-type silicon substrate 60 and the aluminum wiring layer 65$g_1$ in a ring-like shape. This embodiment is a semiconductor integrated circuit with a short turn-off time and a high breakdown voltage, which includes a combination of a PNPN switch with two gate terminals of a PNPN four layer structure and a Schottky diode. In the PNPN switch, an anode terminal A is taken out from the aluminum wiring layer 65a through the P-type diffusion layer 69 with a high impurity concentration for the ohmic contact to the P-type diffusion layer 68 with a low impurity concentration. A cathode terminal K is taken out from the N-type diffusion layer 63 with a high impurity concentration through the aluminum wiring layer 65k. A cathode gate terminal GK is taken out from the P-type diffusion layer 61 with a low impurity concentration through the P-type diffusion layer 67 with a high impurity concentration for the ohmic contact and through the aluminum wiring layer 65g₁. An anode gate terminal GA is taken out from the N-type silicon substrate 60 with a low impurity concentration through the N-type diffusion layer 62 with a high impurity concentration for the ohmic contact and through the aluminum wiring layer 65g₂. The P-type diffusion layer 68, the N-type silicon substrate 60, the P-type diffusion layer 61, and the N-type diffusion layer 63 serve as an anode region, an anode gate region, a cathode gate region and a cathode region, respectively.

A Schottky diode is formed by making a contact of the aluminum wiring layer 65g₁ with the N-type silicon substrate 60, having a guard ring formed by the P-type diffusion layer 67 with a high impurity concentration which extends in a ring shape along the periphery or edge of the junction between the aluminum wiring layer 65g₁ and the N-type silicon substrate 60. The P-type diffusion layer 67 forming the guard ring also serves as the P-type diffusion layer 67 with a high impurity concentration for the cathode gate contact of the PNPN switch. The aluminum wiring layer 65g₁ forming the anode of the Schottky barrier diode and the N-type silicon substrate 60 forming the cathode are connected to the cathode gate region and the anode gate region of the PNPN switch within the substrate 60.

Accordingly, the PN junction between the anode gate region and the cathode gate region is clamped by the Schottky barrier diode, so that there is eliminated the storage of the minority carriers in the PN junction. Even if current flows through the Schottky barrier diode, such current is caused by the movement of the majority carriers and almost no minority carriers are stored therein. Accordingly, this embodiment provides a PNPN switch with a high operation speed, or a very short turn-off time, into which a Schottky barrier diode with a desired characteristic is fabricated with a minimum increase of area, by straightly using the conventional high breakdown voltage process.

As has been described above, according to the invention, a Schottky barrier diode with a small voltage drop is fabricated into a semiconductor element with a minimum increase of area by using a conventional high breakdown voltage process having a deep diffusion layer. Accordingly, there is provided a semiconductor integrated circuit with an extremely high degree of integration, a high turn-off speed, and a high breakdown voltage compared to the conventional one.

What we claim is:

1. A semiconductor integrated circuit comprising:
   a semiconductor substrate of a first conductivity type;
   at least one first diffusion layer with a low impurity concentration of a second conductivity type opposite to the first conductivity type formed within said substrate;
   a second diffusion layer with a high impurity concentration of the first conductivity type formed within said first diffusion layer;
   a third diffusion layer with a high impurity concentration of the first conductivity type formed within said substrate;
   wiring layers formed on the surfaces of said second and third diffusion layers;
   a metal layer directly contacting with said substrate; and
   a fourth diffusion layer of the second conductivity type shaped within said substrate like a frame under the peripheral portion of said metal layer and formed more shallowly than said first and said second diffusion layer, in which
   a portion of said second diffusion layer overlaps a portion of said first diffusion layer; said metal layer serves as an external contact wiring layer for said first diffusion layer; said substrate, said first diffusion layer and said second diffusion layer are used as a collector region, a base region and an emitter region, respectively, thereby to form an NPN transistor; said third diffusion region is used as an ohmic contact for said collector region; and said substrate, said metal layer and said fourth diffusion layer are used as a cathode region, an anode region and a guard ring, respectively, thereby to form a Schottky barrier diode.

2. A semiconductor integrated circuit comprising:
   a semiconductor substrate of a first conductivity type;
   first and second diffusion layers with a low impurity concentration of a second conductivity type opposite to the first conductivity type, which are formed within said substrate;
   a third diffusion layer with a high impurity concentration of the second conductivity type formed within said first diffusion layer;
   a fourth diffusion layer with a high impurity concentration of the first conductivity type formed within said substrate;
   wiring layers formed on said third and fourth diffusion layers;
   a metal layer directly contacting with said substrate;
   a fifth diffusion layer with a high impurity concentration of the second conductivity type shaped within said substrate like a frame under the peripheral portion of said metal layer and formed more shallowly than said first and second diffusion layers, in which
   a portion of said fifth diffusion layer overlaps a portion of said second diffusion layer; said metal layer is used as an external connection wiring layer for said second diffusion layer; said substrate, said first diffusion layer and said second diffusion layer are used as a base region, an emitter region and a collector region, respectively, thereby to form a PNP transistor; said fourth diffusion layer is used as an ohmic contact for said base region; and said substrate, said metal layer and said fifth diffusion layer are usd as a cathode region, an anode region and a guard ring, respectively, thereby to form a Schottky barrier diode.

3. A semiconductor integrated circuit comprising:
   a semiconductor substrate of a first conductivity type;
   at least first and second diffusion layers of a second conductivity type opposite to the first conductivity type formed within said substrate;

a third diffusion layer with a high impurity concentration of the second conductivity type formed within said first diffusion layer;
a fourth diffusion layer with a high impurity concentration of the first conductivity type formed within said second diffusion layer;
a fifth diffusion layer with a high impurity concentration of the first conductivity type formed within said substrate;
wiring layers formed on the surfaces of said third, fourth and fifth diffusion layers;
a metal layer directly contacting with said substrate; and
a sixth diffusion layer with a high impurity concentration of the second conductivity type which is shaped within said substrate like a frame and disposed under the peripheral portion of said metal layer and formed more shallowly than said first and second diffusion layers, in which
a portion of said sixth diffusion layer overlaps a portion of said second diffusion layer; said metal layer is used as an external connection wiring layer for said second diffusion layer; said first diffusion layer, said substrate, said second diffusion layer and said fourth diffusion layer respectively are used as an anode region, an anode gate region, a cathode gate region and a cathode region, respectively, thereby to form a PNPN switch; and said substrate, said metal layer, and said sixth diffusion layer are used as a cathode region, an anode region and a guard ring, respectively, thereby to form a Schottky barrier diode.

* * * * *